(12) United States Patent
Chang et al.

(10) Patent No.: US 7,829,887 B2
(45) Date of Patent: Nov. 9, 2010

(54) ORGANIC LIGHT EMITTING DIODE DISPLAY DEVICE AND METHOD OF MANUFACTURING THE SAME

(75) Inventors: Seung Wook Chang, Yongin (KR); Mu-Hyun Kim, Yongin (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 0 days.

(21) Appl. No.: 12/457,457

(22) Filed: Jun. 11, 2009

(65) Prior Publication Data

US 2009/0309108 A1    Dec. 17, 2009

(30) Foreign Application Priority Data

Jun. 11, 2008    (KR) ...................... 10-2008-0054858

(51) Int. Cl.
| | |
|---|---|
| H01L 29/08 | (2006.01) |
| H01L 35/24 | (2006.01) |
| H01L 51/00 | (2006.01) |
| H01L 29/04 | (2006.01) |
| H01L 29/15 | (2006.01) |
| H01L 31/036 | (2006.01) |
| H01L 27/15 | (2006.01) |
| H01L 29/26 | (2006.01) |
| H01L 31/12 | (2006.01) |
| H01L 33/00 | (2006.01) |
| H01L 29/18 | (2006.01) |
| H01L 29/20 | (2006.01) |
| H01L 21/00 | (2006.01) |
| H01L 51/40 | (2006.01) |

(52) U.S. Cl. ............................ 257/40; 257/59; 257/72; 257/79; 257/88; 257/89; 257/E21.158; 257/E33.001; 257/E33.055; 257/E51.022; 438/35; 438/82; 438/99

(58) Field of Classification Search .................. 257/40, 257/59, 72, 79, 88–89, E21.158, E33.001, 257/E33.055, E51.022; 438/35, 82, 99

See application file for complete search history.

(56) References Cited

U.S. PATENT DOCUMENTS 6,384,529 B2 *    5/2002    Tang et al. .................. 313/506
7,292,294 B2 *    11/2007    Hung et al. .................. 349/106

(Continued)

FOREIGN PATENT DOCUMENTS

KR    10-2005-0082644 A    8/2005

(Continued)

Primary Examiner—Ida M Soward
(74) Attorney, Agent, or Firm—Lee & Morse

(57) ABSTRACT

An OLED display device includes a plurality of pixels including sub-pixels arranged along a first direction, the sub-pixels being arranged in an order emitting red, green, and blue lights along the first direction or in a reverse order, wherein an arrangement of colors of light emitted from sub-pixels of one pixel is symmetrical to an arrangement of colors of light emitted from sub-pixels of an adjacent pixel, and wherein a light emitting layer of the sub-pixel emitting red light includes a light emitting layer emitting red light and a light emitting layer emitting green light, a light emitting layer of the sub-pixel emitting green light includes a light emitting layer emitting green light, and a light emitting layer of the sub-pixel emitting blue light includes a light emitting layer emitting blue light and a light emitting layer emitting green light.

18 Claims, 7 Drawing Sheets

U.S. PATENT DOCUMENTS

| | | | |
|---|---|---|---|
| 7,309,955 B2 * | 12/2007 | Kim | 313/500 |
| 7,402,946 B2 * | 7/2008 | Park et al. | 313/504 |
| 7,547,462 B2 | 6/2009 | Kim et al. | |
| 7,679,093 B2 * | 3/2010 | Park et al. | 257/98 |
| 2007/0164275 A1 * | 7/2007 | Ishiguro | 257/40 |
| 2007/0200492 A1 * | 8/2007 | Cok et al. | 313/506 |
| 2007/0257943 A1 * | 11/2007 | Miller et al. | 345/694 |
| 2009/0102352 A1 * | 4/2009 | Cok et al. | 313/498 |
| 2009/0135104 A1 * | 5/2009 | Jeong | 345/76 |
| 2009/0200544 A1 * | 8/2009 | Lee et al. | 257/40 |
| 2009/0200922 A1 * | 8/2009 | Lee et al. | 313/504 |
| 2010/0124796 A1 * | 5/2010 | Yamazaki et al. | 438/29 |

FOREIGN PATENT DOCUMENTS

| | | |
|---|---|---|
| KR | 10-2006-0036328 A | 4/2006 |
| KR | 10-2006-0055098 A | 5/2006 |
| KR | 10-2006-0112965 A | 11/2006 |

* cited by examiner

ORGANIC LIGHT EMITTING DIODE DISPLAY DEVICE AND METHOD OF MANUFACTURING THE SAME

BACKGROUND

1. Field

Example embodiments relate to an organic light emitting diode display device. More particularly, example embodiments relate to a high resolution organic light emitting diode display device, wherein deposition of a light emitting layer for each sub-pixel is easy and precision of patterns of sub-pixels is improved.

2. Description of the Related Art

As organic light emitting diode (OLED) display devices have a wide viewing angle, excellent contrast ratio, and high response speed, they are considered as the next-generation display devices.

An OLED display device may include a first electrode and a second electrode facing each other, and an intermediate layer including at least a light emitting layer between the first and second electrodes. The first electrode, the second electrode, and the intermediate layer may be formed using various methods, such as a deposition method. When the deposition method is used, a mask with opening portions having the same patterns as the patterns of a film to be deposited is used. The mask may be closely adhered to a surface where the film is to be formed, and a material may be deposited on the surface through the mask to form a thin film having predetermined patterns.

When the conventional OLED display device includes a plurality of pixels, e.g., each pixel including red, green and blue sub-pixels, light emitting layers of the sub-pixels may be formed using the deposition method. For example, the light emitting layers of all the sub-pixels emitting red light may be formed by deposition through a mask at the same time, and then the light emitting layers of all the sub-pixels emitting blue light may be formed by deposition at the same time, and then the light emitting layers of all the sub-pixels emitting green light may be formed by deposition at the same time.

However, since distances between adjacent sub-pixels become smaller in order to manufacture display devices having high image quality, the distance between the opening portions of a mask for depositing light emitting layers of sub-pixels may be also reduced. For example, if red, green, and blue sub-pixels are repeatedly formed in this order along a first direction, a distance along the first direction between two adjacent opening portions of the mask for the blue light emitting layer in QCIF OLED having a resolution of 140 ppi may be about 0.068 mm, i.e., a distance along the first direction between two adjacent sub-pixels emitting blue light. While a conventional fine pitch mask, e.g., a mask in which the distance between adjacent opening portions is about 0.068 mm, may facilitate manufacturing of an OLED display device having high image quality, there may be many limitations, e.g., physical limits, in manufacturing such a fine pitch mask. In addition, as the pitch of the mask is reduced, it may be difficult to pattern a mask and to align the patterns of the mask with corresponding portions of the OLED display device, i.e., portions where the light emitting layers are to be deposited. Inaccurate alignment and patterning of the mask may cause inaccurate film deposition of the light emitting layers, thereby reducing display properties and image quality of the OLED display device.

SUMMARY

Example embodiments are therefore directed to an OLED display device and a method of manufacturing the same, which substantially overcome one or more of the problems due to the limitations and disadvantages of the related art.

It is therefore a feature of an example embodiment to provide an OLED display device having an arrangement of sub-pixels that provides improved deposition with an increased precision.

It is therefore another feature of an example embodiment to provide a method of manufacturing an OLED display device by arranging sub-pixels therein to provide improved deposition and precision.

At least one of the above and other features and advantages may be realized by providing an OLED display device, including a plurality of pixels, wherein each of the pixels comprises sub-pixels respectively emitting red, blue, and green light in the order or reverse order along a first direction, wherein the sub-pixels formed in the pixels along the first direction of the organic light emitting display device are disposed such that the arrangement of colors of light emitted from each sub-pixel of one pixel is symmetrical to the arrangement of colors of light emitted from each sub-pixel of the neighboring pixel with respect to a space between the pixels along the first direction, and wherein a light emitting layer of the sub-pixel emitting red light comprises a light emitting layer emitting red light and a light emitting layer emitting green light, and a light emitting layer of the sub-pixel emitting the green light comprises a light emitting layer emitting green light, and a light emitting layer of the sub-pixel emitting blue light comprises a light emitting layer emitting blue light and a light emitting layer emitting green light.

Each of the sub-pixels may include a first electrode and a second electrode facing each other, and the light emitting layer of each of the sub-pixels is interposed between the first electrode and the second electrode, and wherein the light emitting layer emitting red light or the light emitting layer emitting blue light of two sub-pixels adjacent to each other with respect to a space between the adjacent pixels along the first direction is formed as one unit.

The light emitting layer emitting green light of the plurality of the sub-pixels may be formed as one unit.

Each of the sub-pixels may include an anode electrode and a cathode electrode facing each other, and a light emitting layer of each of the sub-pixels is interposed between the anode electrode and the cathode electrode, and a light emitting layer emitting red light of the sub-pixel emitting red light may be disposed between a light emitting layer emitting green light of the sub-pixel emitting red light and the anode electrode, and a light emitting layer emitting blue light of the sub-pixel emitting blue light may be disposed between a light emitting layer emitting green light of the sub-pixel emitting blue light and the anode electrode.

The hole mobility of the light emitting layer emitting red light of the sub-pixel emitting red light may be lower than the hole mobility of the light emitting layer emitting green light, and the electron mobility of the light emitting layer emitting green light may be higher than the electron mobility of the light emitting layer emitting red light.

The hole mobility of the light emitting layer emitting blue light of the sub-pixel emitting blue light may be lower than the hole mobility of the light emitting layer emitting green light, and the electron mobility of the light emitting layer emitting green light may be higher than the electron mobility of the light emitting layer emitting blue light.

Each of the sub-pixels may include an anode electrode and a cathode electrode facing each other, and a light emitting layer of each of the sub-pixels is interposed between the anode electrode and the cathode electrode, and a light emitting layer emitting green light of the sub-pixel emitting red light may be disposed between a light emitting layer emitting red light of the sub-pixel emitting red light and the anode electrode, and a light emitting layer emitting green light of the sub-pixel emitting blue light may be disposed between a light emitting layer emitting blue light of the sub-pixel emitting blue light and the anode electrode.

The electron mobility of the light emitting layer emitting red light of the sub-pixel emitting red light may be lower than the electron mobility of the light emitting layer emitting green light, and the hole mobility of the light emitting layer emitting green light may be higher than the hole mobility of the light emitting layer emitting red light.

The electron mobility of the light emitting layer emitting blue light of the sub-pixel emitting blue light may be lower than the electron mobility of the light emitting layer emitting green light, and the hole mobility of the light emitting layer emitting green light may be higher than the hole mobility of the light emitting layer emitting blue light.

The sub-pixels in a second direction that is perpendicular to the first direction may emit light of the same color.

Each of the sub-pixels may include a first electrode and a second electrode facing each other, and a light emitting layer of each of the sub-pixels may be interposed between the first electrode and the second electrode, and the light emitting layers emitting red light or blue light of two of the sub-pixels adjacent to each other with respect to a space between the adjacent pixels along the first direction may be formed as one unit.

The light emitting layers of the sub-pixels in the second direction may be formed as one unit. The sub-pixels arrangement along the first direction with respect to color of light emitted from respective sub-pixels may include an order of red, green, blue, blue, green, red, red, green, blue, blue, and so forth.

At least one of the above and other features and advantages may be realized by providing a method of forming an OLED display device, including forming a plurality of pixels including sub-pixels in a predetermined order along a first direction, each sub-pixel emitting red, green, or blue light, and the predetermined order of the sub-pixels including sub-pixels arranged in an order emitting red, green, and blue lights along the first direction or in a reverse order, wherein the sub-pixels formed in the pixels along the first direction are disposed, such that the arrangement of colors of light emitted from sub-pixels of one pixel is symmetrical to an arrangement of colors of light emitted from sub-pixels of an adjacent pixel along the first direction, an axis of symmetry of the symmetrical arrangement being a space between the adjacent pixels, and wherein a light emitting layer of the sub-pixel emitting red light is formed to include a light emitting layer emitting red light and a light emitting layer emitting green light, a light emitting layer of the sub-pixel emitting green light is formed to include a light emitting layer emitting green light, and a light emitting layer of the sub-pixel emitting blue light is formed to include a light emitting layer emitting green light and a light emitting layer emitting blue light.

Forming each sub-pixel may include forming the light emitting layer between a first electrode and a second electrode, light emitting layers emitting red light or light emitting layers emitting blue light of two adjacent sub-pixels of respective pixels adjacent to each other along the first direction being formed as one unit via a single opening in a deposition mask. A light emitting layer emitting green light may be formed as one unit. The sub-pixels in a second direction may be arranged to emit light of a same color, the second direction being perpendicular to the first direction. The light emitting layers of the sub-pixels in the second direction may be formed as one unit.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
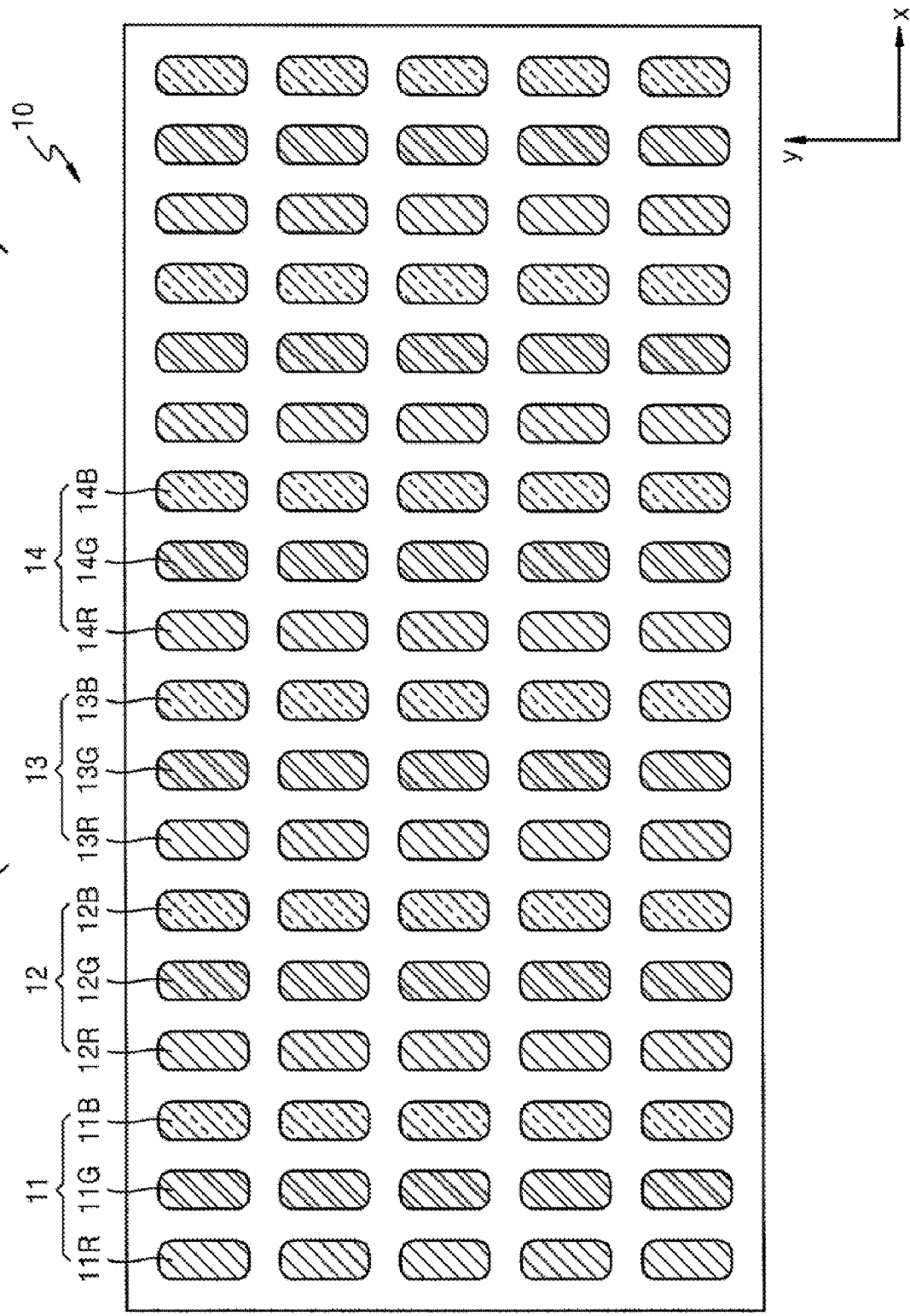
FIG. 1 illustrates a plan view of patterns of light emitting layers of a conventional OLED display device.

Korean Patent Application No. 10-2008-0054858, filed on Jun. 11, 2008 in the Korean Intellectual Property Office, and entitled "Organic Light Emitting Display", is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 3:
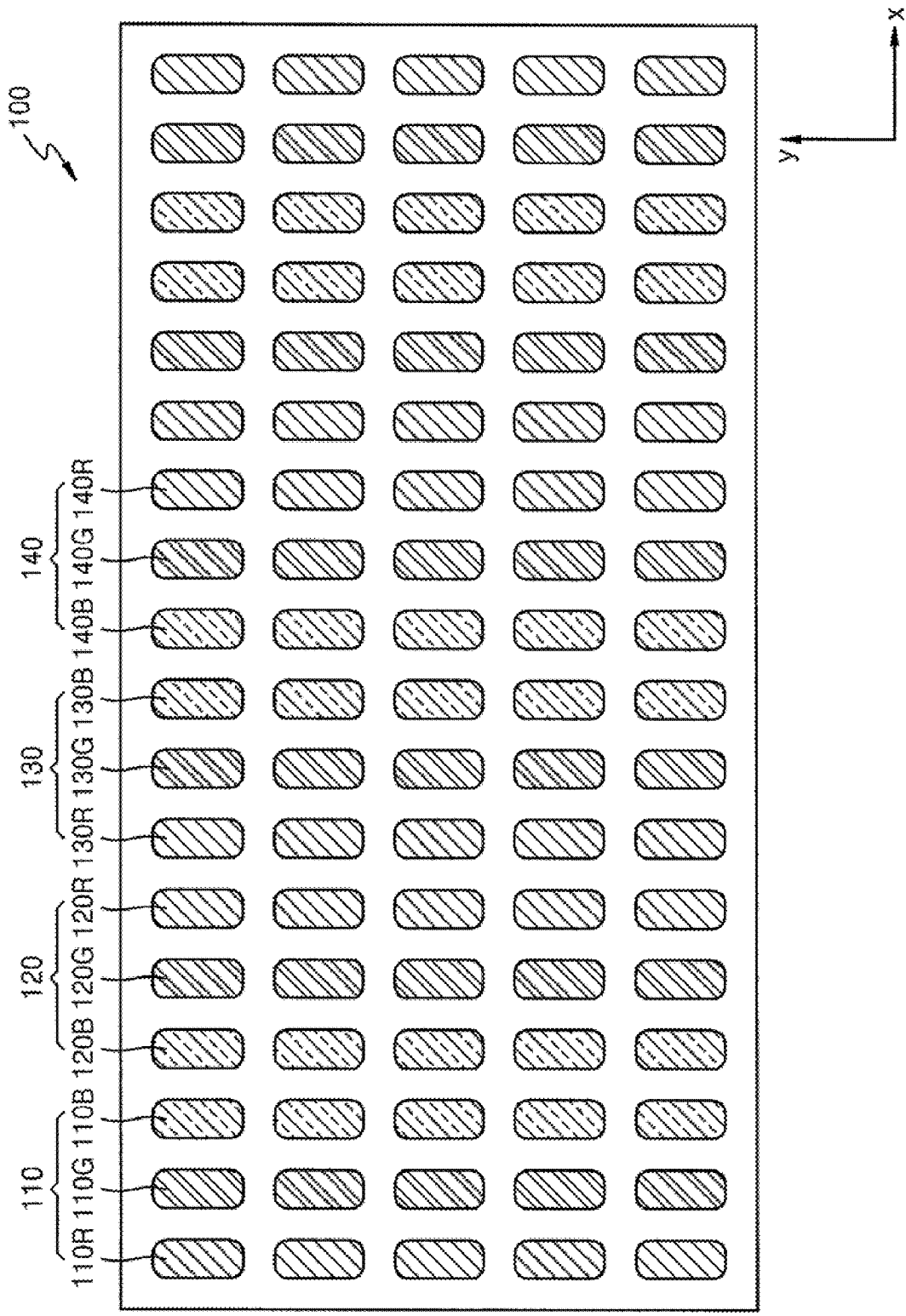
FIG. 3 illustrates a plan view of patterns of light emitting layers of an OLED display device according to an example embodiment.
Figure 4:
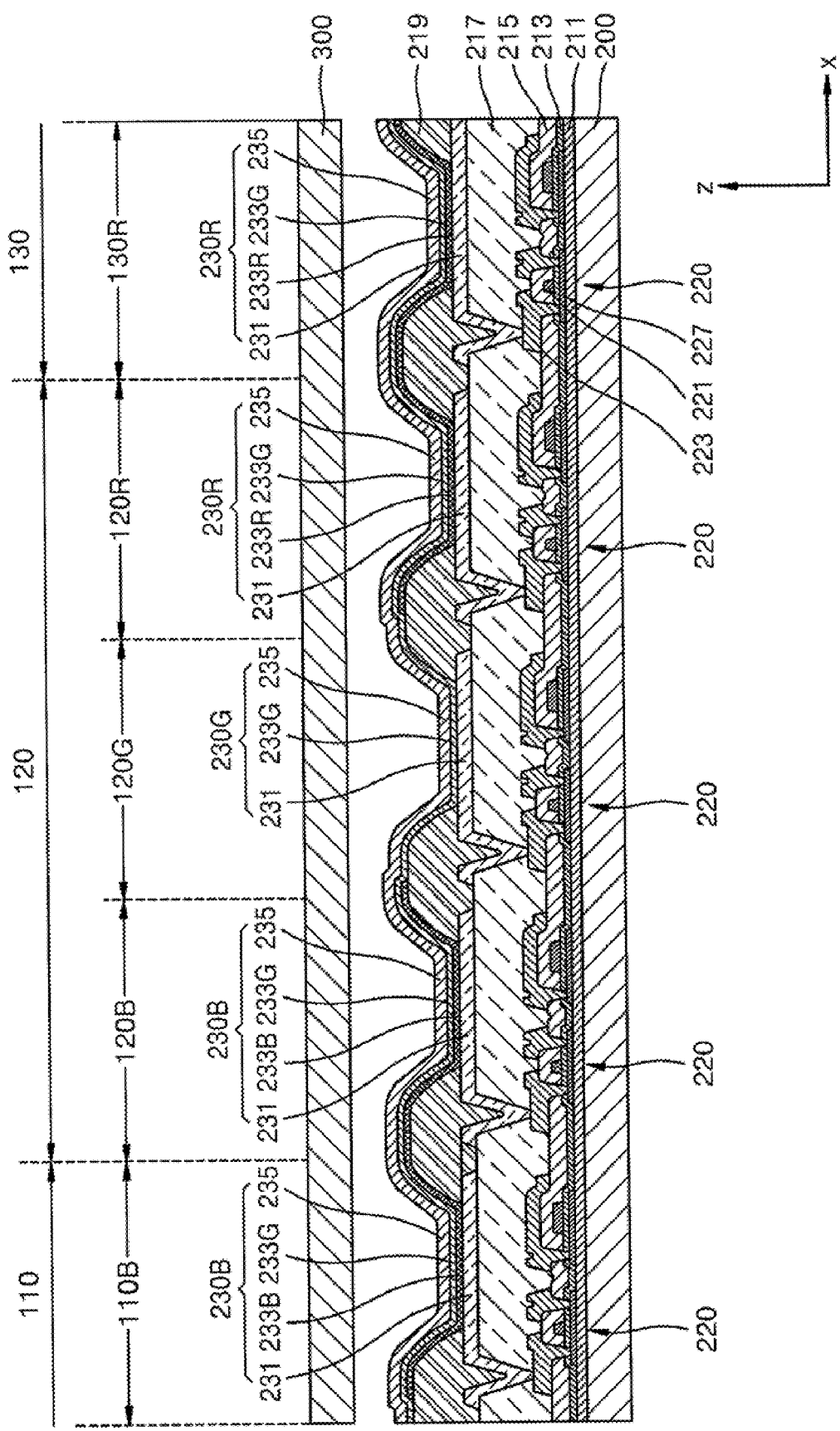
FIG. 4 illustrates a cross-sectional view of a plurality of sub-pixels of the OLED of FIG. 3.

FIG. 3 illustrates a plan view of a schematic arrangement of light emitting layers of an OLED display device 100 according to an example embodiment, and FIG. 4 illustrates a cross-sectional view of a plurality of sub-pixels of the OLED display device 100 of FIG. 3. FIG. 3 illustrates the patterns of light emitting layers of the OLED display device 100, and it may also be regarded as illustrating each of sub-pixels for convenience of understanding. The same applies also to embodiments to be described later.

Referring to FIG. 3, the OLED display device 100 may include a plurality of pixels 110, 120, 130, and 140. Each of the pixels may include a sub-pixel emitting red light, a sub-pixel emitting green light, and a sub-pixel emitting blue light along a first direction, e.g., along an x-direction in FIG. 3. The plurality of pixels may respectively include a plurality of corresponding sub-pixels emitting red light, green light, and blue light in this order or in a reverse order along the first direction. The sub-pixels included in the pixels along the first direction (x-direction) of the OLED display device 100 may be disposed so that an arrangement of sub-pixels in each pixel may be symmetrical to an arrangement of sub-pixels in an adjacent pixel with respect to a space between the two adjacent pixels along the first direction.

For example, the pixels 110, 120, 130, and 140 may be arranged in a row along the first direction, i.e., the x-direction of FIG. 3, and may include sub-pixels emitting red, green, and blue light along the x-direction. Assuming that the pixels disposed in the uppermost row of the patterns of the light emitting layers (sub-pixels) illustrated in FIG. 3 are each a first pixel 110, a second pixel 120, a third pixel 130, and a fourth pixel 140, the first pixel 110 may include a sub-pixel 110R emitting red light, a sub-pixel 110G emitting green light, and a sub-pixel 110B emitting blue light along the x-direction.

Similarly, the second pixel 120, the third pixel 130, and the fourth pixel 140 may include sub-pixels. The sub-pixels 120R, 120G, and 120B of the second pixel 120 adjacent to the first pixel 110 may be arranged to be symmetrical to the sub-pixels 110R, 110G, and 110B of the first pixel 110 with respect to a space between the first pixel 110 and the second pixel 120. In other words, the sub-pixels 120R, 120G, and 120B of the second pixel 120 that respectively emit red light, green light, and blue light may be arranged to be symmetrical to the arrangement of the sub-pixels 110R, 110G, and 110B of the first pixel 110 respectively emitting red light, green light, and blue light with respect to the space between the first pixel 110 and the second pixel 120. Accordingly, as illustrated in FIG. 3, when the first pixel 110 includes the sub-pixel 110R emitting red light, the sub-pixel 110G emitting green light, and the sub-pixel 110B emitting blue light along the x-direction, the second pixel 120, which is adjacent to the first pixel 110, may include the sub-pixel 120B emitting blue light, the sub-pixel 120G emitting green light, and the sub-pixel 120R emitting red light along the x-direction. In other words, as illustrated in FIG. 3, the sub-pixels of the first and second pixels 110 and 120 may be arranged so the blue light emitting sub-pixels 110B and 120B of the first and second pixels 110 and 120, respectively, may be adjacent to each other.

Also, the sub-pixels 130R, 130G, and 130B of the third pixel 130 emitting red light, green light, and blue light, respectively, may be arranged to be symmetrical to the arrangement of the sub-pixels 120R, 120G, and 120B of the second pixel 120 with respect to a space between the second pixel 120 and the third pixel 130. Accordingly, as illustrated in FIG. 3, as the second pixel 120 includes the sub-pixel 120B emitting blue light, the sub-pixel 120G emitting green light, and the sub-pixel 120R emitting red light along the x-direction, the third pixel 130, which is adjacent to the second pixel 120, may include the sub-pixel 130R emitting red light, the sub-pixel 130G emitting green light, and the sub-pixel 130B emitting blue light along the x-direction. In other words, as illustrated in FIG. 3, the sub-pixels of the second and third pixels 120 and 130 may be arranged so the red light emitting sub-pixels 120R and 130R of the second and third pixels 120 and 130, respectively, may be adjacent to each other.

The fourth pixel 140 and other pixels may include sub-pixels arranged in this manner, and consequently, the sub-pixels R emitting red light, the sub-pixels G emitting green light, and the sub-pixels B emitting blue light of the OLED display device 100 may be arranged in the order of R, G, B, B, G, R, R, G, B, B, G, R, etc. along the first direction, as illustrated in FIG. 3. For example, as further illustrated in FIG. 3, the sub-pixels in the OLED display device 100 along the y-direction may be arranged so each column of sub-pixels along the y-direction has a same color.

The configuration of the OLED display device 100 according to the current embodiment of the present invention will be described with reference to FIG. 4, which is a cross-sectional view illustrating a plurality of sub-pixels of the OLED display device 100 having the arrangement described previously with reference to FIG. 3.

FIG. 4 illustrated a schematic view of a portion of the first pixel 110, the second pixel 120, and the third pixel 130.

Referring to FIG. 4, a plurality of thin film transistors 220 may be formed on a substrate 200, and organic light emitting elements 230B, 230G, and 230R may be formed on the thin film transistors 220. Each of the organic light emitting elements 230B, 230G, and 230R may include a first electrode 231 electrically connected to a respective thin film transistor 220, a second electrode 235 disposed over the entire surface of the substrate 200, and a light emitting layer disposed between the first electrode 231 and the second electrode 235.

The thin film transistors 220 may be formed on the substrate 200, and may include a gate electrode 221, a source electrode and a drain electrode 223, a semiconductor layer 227, a gate insulating layer 213, and an interlayer insulating layer 215. However, the thin film transistor 220 is not limited to the embodiment illustrated in FIG. 4, and various thin film transistors, e.g., an organic thin film transistor including an organic semiconductor layer, a silicon thin film transistor formed of silicon, and so forth may be used. A buffer layer 211, e.g., formed of silicon oxide or silicon nitride, may be further included between the thin film transistor 220 and the substrate 200.

The organic light emitting elements 230B, 230G, and 230R may include the first electrode 231, the second electrode 235, and a light emitting layer interposed therebetween and formed of an organic material.

The first electrode 231 may function as an anode electrode, and the second electrode 235 may function as a cathode electrode. However, the polarity of the first and second electrodes 231 and 235 may be changed.

The first electrode 231 may be formed as a transparent electrode or a reflective electrode. When formed as a transparent electrode, the first electrode 231 may be formed of, e.g., one or more of indium tin oxide (ITO), indium zinc oxide (IZO), ZnO, and $In_2O_3$. When formed as a reflective electrode, the first electrode 231 may include a reflection layer formed of, e.g., one or more of Ag, Mg, Al, Pt, Pd, Au, Ni, Nd, Ir, Cr or compound of any of these, and a transparent layer, e.g., formed of one or more of ITO, IZO, ZnO, and $In_2O_3$, may be formed on the reflection layer.

The second electrode 235 may also be formed as a transparent electrode or a reflective electrode. When formed as a transparent electrode, the second electrode 235 may include a layer of Li, Ca, LiF/Ca, LiF/Al, Al, Mg, or a compound of any of these deposited on the light emitting layer, and may also include a bus electrode line or an auxiliary electrode formed of a material for a transparent electrode, e.g., ITO, IZO, ZnO, or $In_2O_3$. When formed as a reflective electrode, the second electrode 235 may be formed by depositing, e.g., Li, Ca, LiF/Ca, LiF/Al, Al, Mg, or a compound of any of these.

Also, a pixel defining layer (PDL) 219 may be formed to cover an edge of the first electrode 231 and to have a predetermined thickness away from the first electrode 231. Besides the function of defining a light emitting region at the edge portion of the PDL 219, the second electrode 235 may be spaced apart from the first electrode 231 by a distance corresponding to the thickness of the PDL 219 located therebetween. Accordingly, concentration of an electric field at the edge portion of the first electrode 231 may be prevented, thereby preventing a short circuit between the first electrode 231 and the second electrode 235.

A light emitting layer may be interposed between the first and second electrodes 231 and 235. The light emitting layer will be described in more detail below.

The organic light emitting elements 230B, 230G, and 230R may be electrically connected to the thin film transistor 220 therebelow, and a planarizing layer 217 may be formed between the thin film transistors 220 and the organic light emitting elements 230B, 230G, and 230R. The planarizing layer 217 may be formed to cover and protect the thin film transistors 220, and the organic light emitting elements 230B, 230G, and 230R may be disposed on the planarizing layer 217, so the first electrodes 231 of the organic light emitting elements 230B, 230G, and 230R may be electrically connected to respective thin film transistors 220 via contact holes through the planarizing layer 217.

The organic light emitting elements 230B, 230G, and 230R may be encapsulated by a counter substrate 300. The counter substrate 300 may be formed of various materials, e.g., glass or plastics.

As described above, the sub-pixels included in the pixels of the OLED display device 100 along the first direction (x-direction) may be disposed such that the arrangement of the color of light emitted by each of the sub-pixels of one pixel is symmetrical to the arrangement of the color of light emitted by each of the sub-pixels of the neighboring pixels adjacent along the first direction. That is, the sub-pixel 120B emitting blue light may be disposed as a sub-pixel of the second pixel 120 that may be adjacent to the sub-pixel 110B of the first pixel 110 emitting blue light along the x-direction, and then the sub-pixel 120G emitting green light and the sub-pixel 120R emitting red light of the second pixel 120 may be sequentially disposed after the sub-pixel 120B. Then the sub-pixel 130R of the third pixel 130 emitting red light may be disposed adjacent to the sub-pixel 120R of the second pixel 120 emitting red light.

With respect to the arrangement of the sub-pixels, light emitting layers of the sub-pixels 120R and 130R emitting red light may include a light emitting layer 233R emitting red light and a light emitting layer 233G emitting green light. A light emitting layer of the sub-pixel 120B emitting blue light may include a light emitting layer 233B emitting blue light and a light emitting layer 233G emitting green light. A light emitting layer of the sub-pixel 120G emitting green light may include, e.g., only, a light emitting layer 233G emitting green light.

Figure 5:
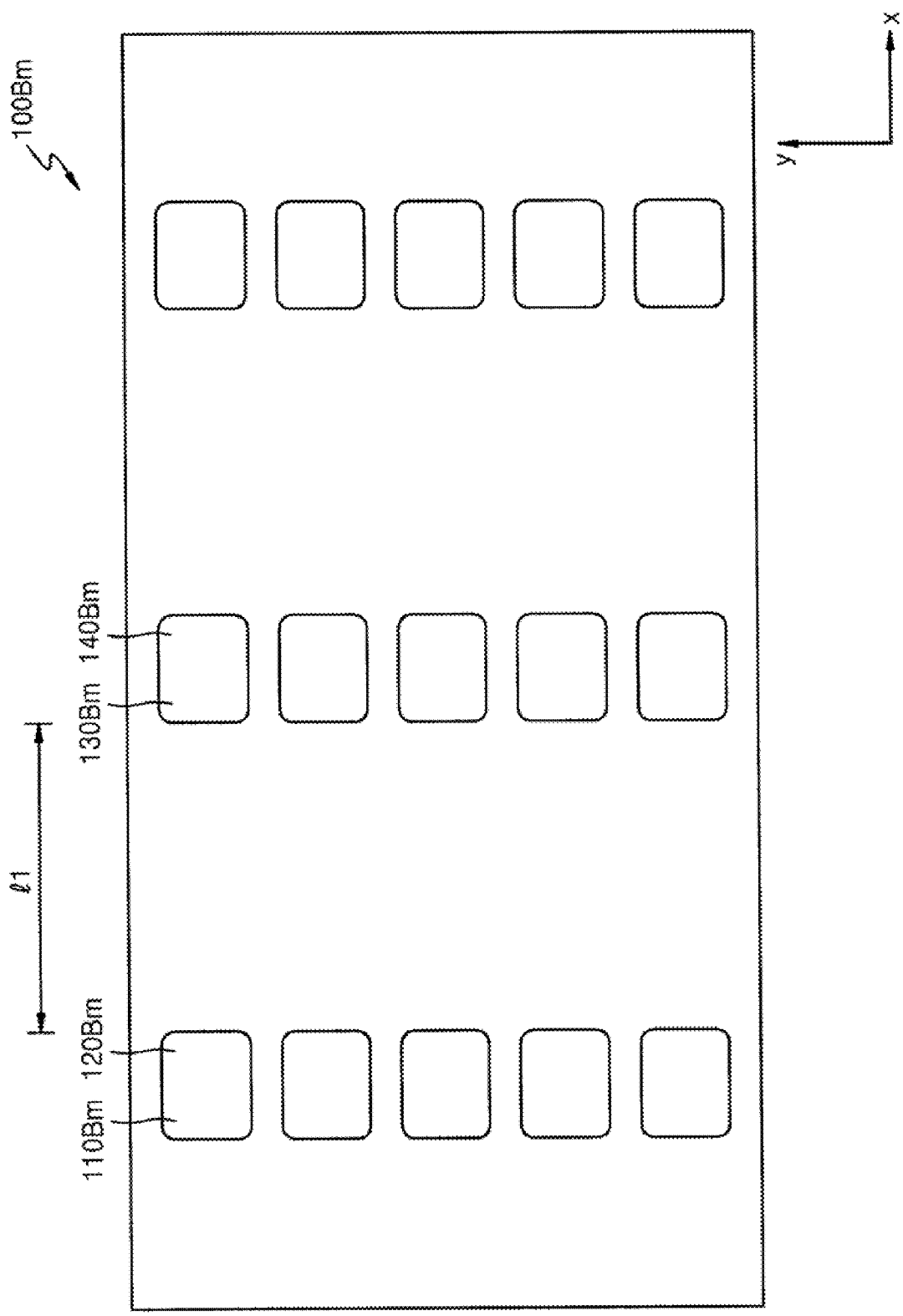
FIG. 5 illustrates a plan view of a mask for depositing blue light emitting layers of the OLED display device of FIG. 3.

For example, when forming light emitting layers of the OLED display device 100, i.e., having sub-pixels arranged as described above, blue light emitting layers may be deposited with a mask 100Bm illustrated in FIG. 5. The mask 100Bm may include opening portions 110Bm, 120Bm, 130Bm, and 140Bm, as illustrated in FIG. 5. Reference numerals 110Bm and 120Bm denote the same opening portions and reference numerals 130Bm and 140Bm denote the same opening portions. For example, opening portions 110Bm and 120Bm may correspond to the light emitting layer 233B of the sub-pixel 110B of the first pixel 110 emitting blue light and the light emitting layer 233B of the sub-pixel 120B of the second pixel 120 emitting blue light, respectively. Similarly, opening portions 130Bm and 140Bm may correspond to the blue light emitting layers of the third and fourth pixels 130 and 140 that are adjacent to each other. That is, by using the mask 100Bm having opening portions having patterns as illustrated in FIG. 5, the light emitting layers 233B emitting blue light of the sub-pixels 110B and 120B adjacent to each other may be formed as one unit, and the blue light emitting layers of the third and fourth pixels 130 and 140 adjacent to each other may be formed as one unit. A distance l1 refers to a distance along the first direction between adjacent blue patterns, i.e., opening portions, in the mask 100Bm. It is noted that a similar mask (not illustrated) may be used for depositing the light emitting layers 233R emitting red light of, e.g., the sub-pixels 120R and 130R, adjacent to each other as one unit.

Since the light emitting layer 233G emitting green light may be formed over the entire surface of the substrate 200 as illustrated in FIG. 4, the light emitting layer 233G emitting green light may be formed by deposition using a general open mask. That is, the light emitting layers 233G emitting green light may be formed as one unit with respect to a plurality of the sub-pixels, e.g., the light emitting layers 233G emitting green light may be formed in all the sub-pixels of the OLED display device 100. In the case of the OLED display device 100 illustrated in FIG. 4, light emitting layers 233B emitting blue light and light emitting layers 233R emitting red light may be formed on the first electrodes 231, and then light emitting layers 233G emitting green light may be formed over the entire surface of the substrate 200.

As described above, referring to FIG. 5 illustrating the mask 100Bm having patterned opening portions used in manufacturing light emitting layers of the OLED display device 100 according to example embodiments, as the size of the opening portions included in the mask 100Bm is increased relative to a conventional mask, e.g., to correspond to two adjacent sub-pixels, a distances l1 between the opening portions may be also increased, e.g., to overlap about four sub-pixels between the opening portions. Accordingly, as the size of the sub-pixels and a distance therebetween is decreased, a decrease in a size of the opening portions in the mask 100Bm and the distances l1 therebetween may be small relative to an initial size thereof. In other words, since the opening portions included in the mask 100Bm and distances therebetween are at least twice as large as sizes of openings and distances therebetween in a conventional mask, a decreased size of sub-pixels may have a smaller effect on a pitch of the mask 100Bm as compared to conventional masks, thereby facilitating accurate patterning and alignment.

Figure 2:
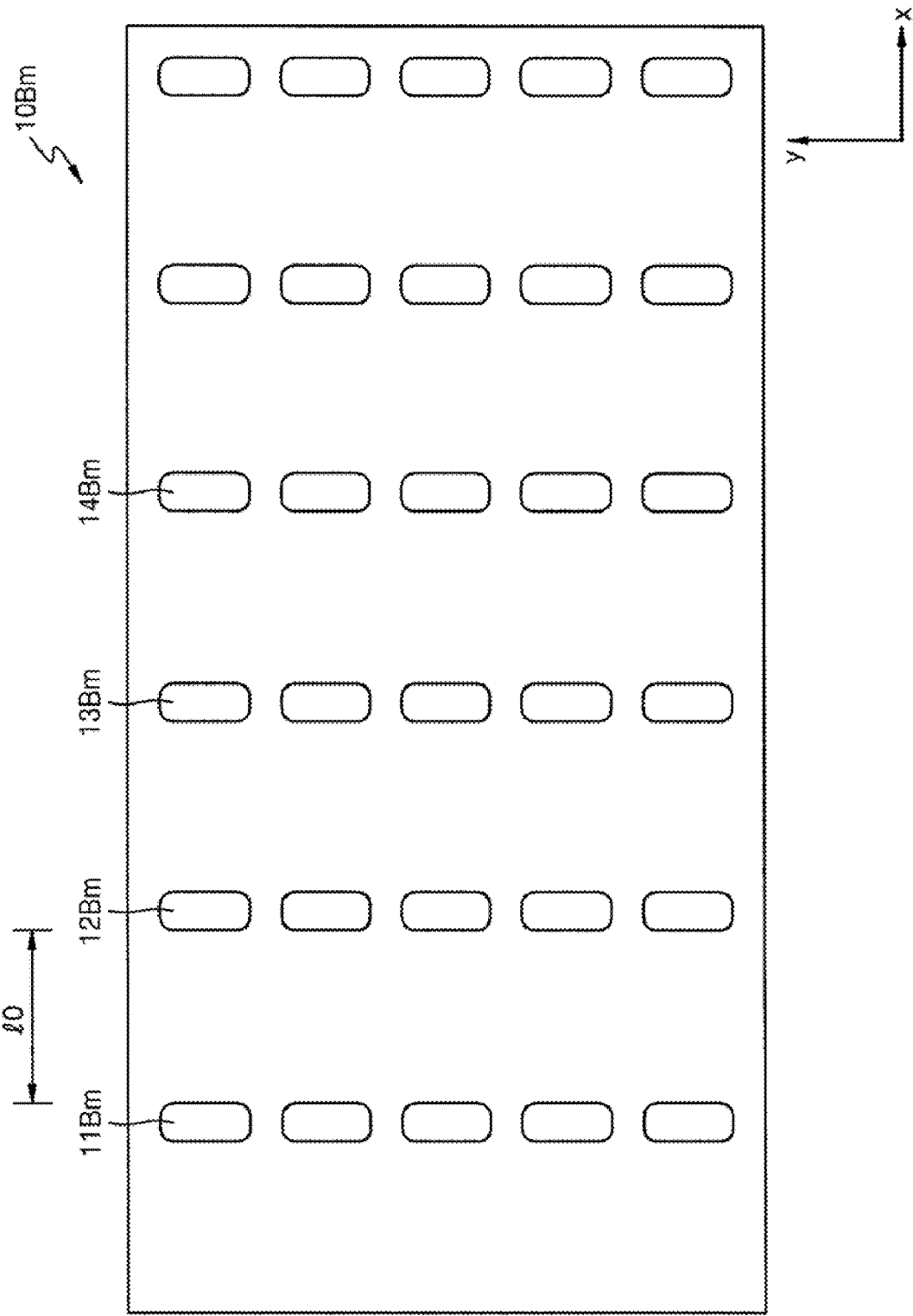
FIG. 2 illustrates a plan view of a conventional mask for depositing blue light emitting layers of the OLED display device of FIG. 1.

In particular, when sub-pixels 11 to 14 of a conventional OLED display device 10 are arranged repeatedly along the first direction, e.g., each pixel including sub-pixels R, G, B, etc. in that order, as illustrated in FIG. 1, a conventional mask for depositing corresponding light emitting layers may have a separate opening portion for each sub-pixel. For example, as illustrated in FIG. 2, each opening portion in a conventional mask 10Bm, i.e., each of openings 11Bm through 14Bm, may correspond to a blue light emitting layer of a single sub-pixel emitting blue light. As further illustrated in FIG. 2, for example, opening portions 11Bm and 12Bm corresponding to sub-pixels emitting blue light may have a distance l0 therebetween, i.e., a distance overlapping about two sub-pixels, so a decreased size of the sub-pixels may cause a reduced distance l0 therebetween, e.g., below about 0.068 mm. Since there are physical limits to a reduced pitch of the conventional mask 10Bm in FIG. 2, formation of the conventional OLED display device 10 via the conventional mask 10Bm may include inaccurate sub-pixel deposition.

However, the sub-pixel arrangement according example embodiments and use of the mask 100Bm illustrated in FIG. 5 may facilitate reduced sub-pixel size, while maintaining ease of mask patterning and alignment, and providing easy formation of the light emitting layers. That is, when the mask 100Bm illustrated in FIG. 5 is used to deposit light emitting layers according to the arrangement of the sub-pixels of the OLED display device 100 illustrated in FIGS. 3 and 4, the distance l1 between the opening portions 120Bm and 130Bm included in the mask 100Bm may be larger than the distance l0, e.g., the distance l1 may equal about 2*l0. Accordingly, the surface area of the opening portions 120Bm and 130Bm included in the mask 100Bm may be also two times of the surface area of the respective opening portions 11Bm and 12Bm included in the conventional mask 10Bm. In the case of a QCIF OLED display device having resolution of 140 ppi, the distance l1 between the opening portions 120Bm and 130Bm illustrated in FIG. 5 may be about 0.1368 mm, which is substantially greater than the distance l0, i.e., about 0.068 mm, between the opening portions 11Bm and 12Bm included in the conventional mask 10Bm illustrated in FIG. 2. Accordingly, the distance between the opening portions in the mask 100Bm in FIG. 5 may be further easily reduced, and as a result, the OLED display device 100 may have high image quality.

In another example, the light emitting layers 233B emitting blue light of the sub-pixels 110B and 120B emitting blue light and adjacent to each other may not be formed as one unit (not illustrated). In this case, one opening portion commonly denoted with reference numerals 110Bm and 120Bm may be divided into two opening portions adjacent to each other, i.e., an opening portion 110Bm and an opening portion 120Bm. However, in this case, since the sub-pixels 110B and 120B are adjacent to each other and emit light of the same color, even if a minor error is generated in depositing the light emitting layers of the adjacent sub-pixels having a space therebetween, image realization of the whole OLED display device may not be affected because the sub-pixels emit the same color of light. Thus, as the distance between the sub-pixels is reduced, decrease in the yield may be prevented and the manufacturing costs may be reduced when manufacturing a display device having high image quality and fine pitch.

Figure 6:
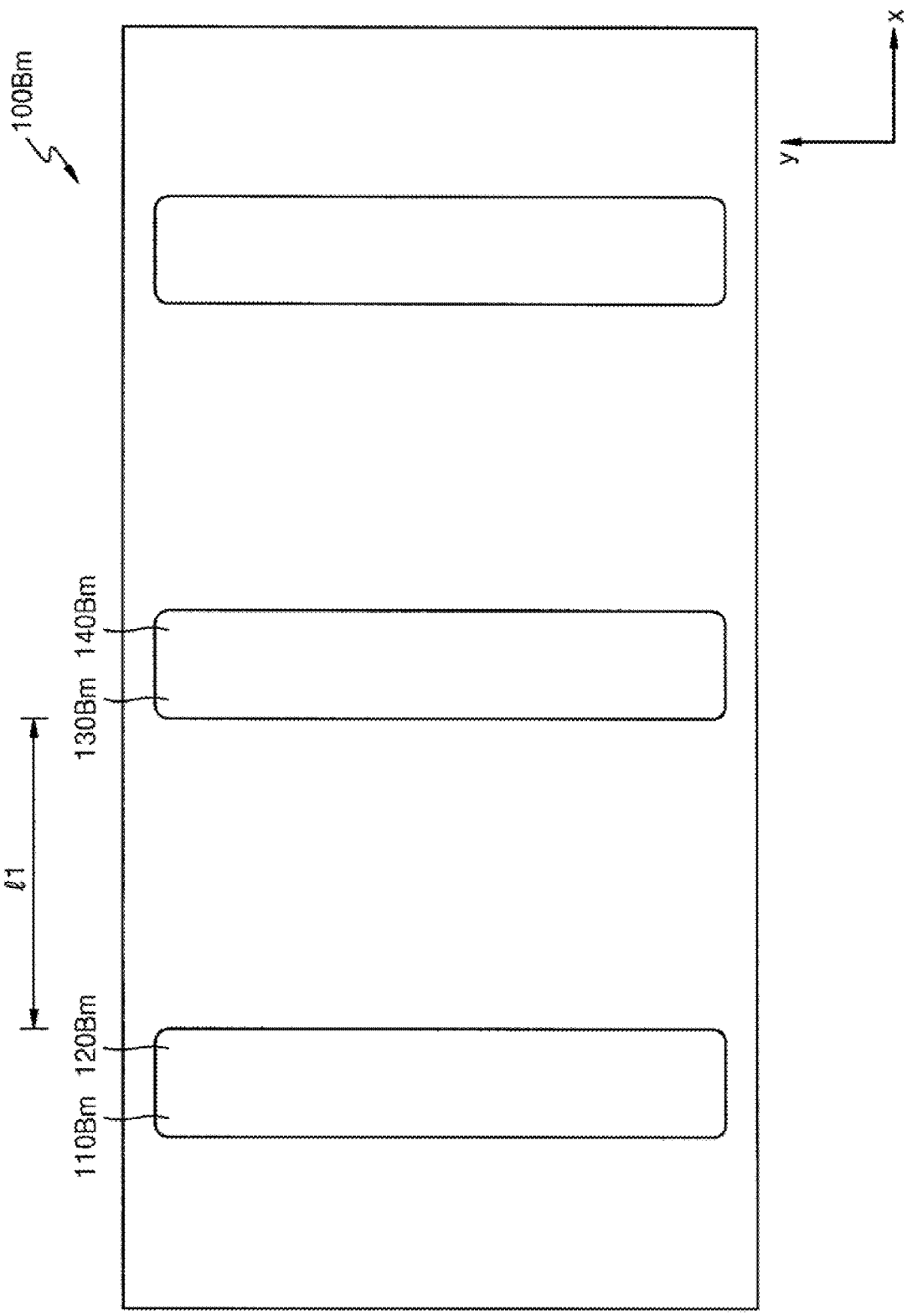
FIG. 6 illustrates a plan view of another example embodiment of a mask for depositing green light emitting layers of the OLED display device of FIG. 3.

As illustrated in FIG. 3, the sub-pixels in a second direction (y-direction) at a right angle to the first direction (x-direction) may emit light of the same color. In this case, as illustrated in FIG. 6, a mask in which the opening portions may be also formed as one unit along the second direction (y-direction) may be used. Here, the light emitting layers may be formed as one unit along the second direction (y-direction).

As described above, in the OLED display device 100 having the structure illustrated in FIGS. 3 and 4, the light emitting layers of the sub-pixel 120B emitting blue light may include the light emitting layer 233G emitting green light in addition to the light emitting layer 233B emitting blue light. Also, the light emitting layers of the sub-pixel 120R emitting red light may include the light emitting layer 233G emitting green light in addition to the light emitting layer 233R emitting red light. Accordingly, light emission of the sub-pixel 120B emitting blue light may be adjusted, so that light emission may be generated mainly in the light emitting layer 233B emitting blue light. Similarly, light emission of the sub-pixel 120R emitting red light may be adjusted, so that light emission may be generated mainly in the light emitting layer 233R emitting red light. To this end, materials of the light emitting layer 233B emitting blue light, the light emitting layer 233R emitting red light, and the light emitting layer 233G emitting green light may be selected appropriately.

When the first electrode 231 is an anode electrode and the second electrode 235 is a cathode electrode in the OLED display device 100 of FIG. 4, holes may be supplied from the first electrode 231, and electrons may be supplied from the second electrode 235. Meanwhile, the light emitting layers 233R emitting red light of the sub-pixels 120R and 130R emitting red light may be disposed adjacent to each other and between the light emitting layer 233G of the sub-pixels 120R and 130R emitting green light and the first electrode 231, i.e., the anode electrode. Accordingly, in order that light emission be mainly generated in the light emitting layer 233R emitting red light of the sub-pixels 120R and 130R emitting red light, material of the light emitting layer 233R may be adjusted, so that holes supplied from the first electrode 231 may remain in the light emitting layer 233R emitting red light and not move to the light emitting layer 233G emitting green light. Thus, the hole mobility of the light emitting layer 233R emitting red light of the sub-pixels 120R and 130R emitting red light may be lower than the hole mobility of the light emitting layer 233G emitting green light.

For example, the light emitting layer 233R emitting red light may be formed of a material containing a methoxy electron donor side group, and the light emitting layer 233G emitting green light may be formed of a material containing a dialkylamine(—NR2) electron donor side group. Further, in order that light emission is mainly generated in the light emitting layer 233R emitting red light of the sub-pixels 120R and 130R emitting red light, materials of the light emitting layers may be selected so that electrons supplied from the second electrode 235 may quickly pass through the light emitting layer 233G emitting green light into the light emitting layer 233R emitting red light to recombine with the holes in the light emitting layer 233R. Accordingly, the electron mobility of the light emitting layer 233G emitting green light may be higher than the electron mobility of the light emitting layer 233R emitting red light. For example, the light emitting layer 233G emitting green light may be a material containing a cyano group (—CN) electron acceptor side group, and the light emitting layer 233R emitting red light may be formed of a material containing a fluorine (—F) electron acceptor side group.

The above description is not limited to the sub-pixels 120R and 130R emitting red light, and may also be applied to the sub-pixels 110B and 120B emitting blue light. In other words, regarding the OLED display device 100 of FIG. 4, when the first electrode 231 is an anode electrode and the second electrode 235 is a cathode electrode and the light emitting layer 233B emitting blue light of the sub-pixels 110B and 120B emitting blue light is disposed between the light emitting layer 233G emitting green light and the first electrode 231, holes supplied from the first electrode 231 may preferably not move to the light emitting layer 233G emitting green light, and the electrons supplied from the second electrode 235 may preferably quickly pass the light emitting layer 233G emitting green light and arrive at the light emitting layer 233B emitting blue light. Accordingly, the hole mobility of the light emitting layer 233B emitting blue light of the sub-pixels 110B and 120B emitting blue light may preferably be lower than the hole mobility of the light emitting layer 233G emitting green light.

For example, the light emitting layer 233B emitting blue light may be formed of a material containing a methoxy electron donor side group, and the light emitting layer 233G emitting green light may be formed of a material containing a dialkylamine (—NR2) electron donor side group. Also, the electron mobility of the light emitting layer 233G emitting green light may preferably be higher than the electron mobility of the light emitting layer 233B emitting blue light. Accordingly, e.g., the light emitting layer 233G emitting green light may be a material containing a cyano group (—CN) electron acceptor side group, and the light emitting layer 233R emitting red light may be formed of a material containing a fluorine (—F) electron acceptor side group.

Figure 7:
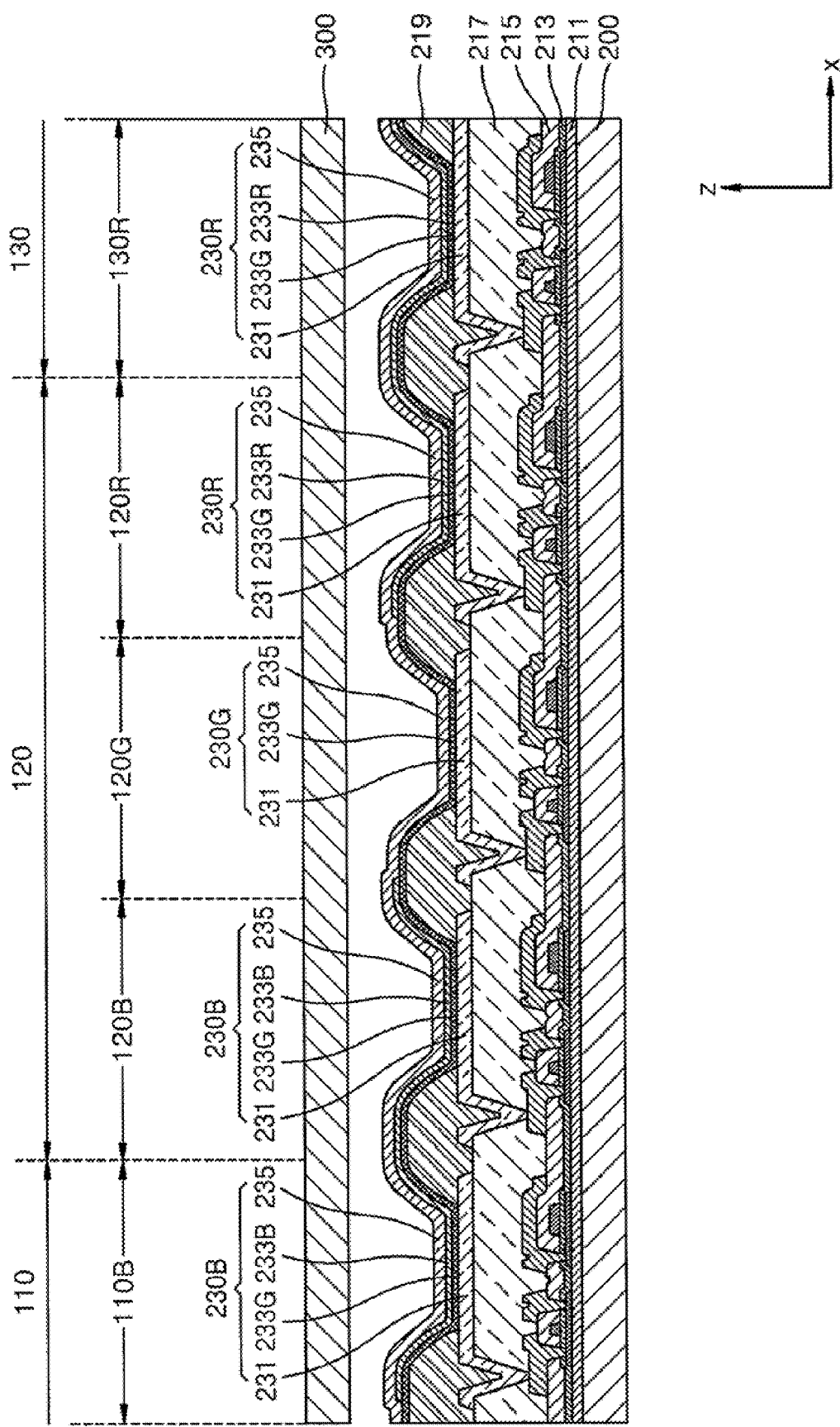
FIG. 7 illustrates a cross-sectional view of a plurality of sub-pixels of an OLED display device according to another example embodiment.

FIG. 7 illustrates a cross-sectional view of a plurality of sub-pixels of an OLED display device according to another embodiment of the present invention. The OLED display device of FIG. 7 is different from the OLED display device of FIG. 4 in terms of the structure of a light emitting layer.

That is, in the case of the OLED display device described with reference to FIG. 4, the light emitting layer 233B emitting blue light and the light emitting layer 233R emitting red light may be deposited using the mask illustrated in FIG. 5 or 6, and then the light emitting layer 233G may be deposited over the entire surface of the substrate 200, i.e., on the deposited light emitting layer 233B emitting blue light and the light emitting layer 233R emitting red light, using an open mask. In the case of the OLED of FIG. 7, however, a light emitting layer 233G emitting green light is deposited over the entire surface of the substrate 200 using an open mask, and then a light emitting layer 233B emitting blue light and a light emitting layer 233R emitting red light may be deposited using a mask as illustrated in FIG. 5 or 6 on the deposited light emitting layer 233G emitting green light. In the OLED display device illustrated in FIG. 7, a distance between the opening portions of the mask may be greater than that in the conventional OLED display device, and thus the distance between the opening portions may be reduced easily when a size of sub-pixels is reduced, so an OLED display device having high image quality may be realized accordingly.

In the OLED display device of FIG. 7, a light emitting layer of the sub-pixel 110B emitting blue light may include a light emitting layer 233G emitting green light in addition to the light emitting layer 233B emitting blue light. Also, a light emitting layer of the sub-pixel 110R emitting red light may include a light emitting layer 233G emitting green light in addition to the light emitting layer 233R emitting red light. Accordingly, light emission in the light emitting layer of the sub-pixel 110B emitting blue light may be adjusted, so that light may be generated mainly in the light emitting layer 233B emitting blue light. Similarly, light emission in the light emitting layer of the sub-pixel 110R emitting red light may be adjusted, so that light may be generated mainly in the light emitting layer 233R emitting red light. To this end, materials of the light emitting layer 233R emitting red light, the light emitting layer 233B emitting blue light, and the light emitting layer 233G emitting green light may be selected appropriately.

In the OLED display device illustrated in FIG. 7, when the first electrode 231 is an anode electrode, and the second electrode 235 is a cathode electrode, holes may be supplied from the first electrode 231, and electrons may be supplied from the second electrode 235. Meanwhile, the light emitting layer 233G emitting green light of the second and third sub-pixels 120R and 130R emitting red light may be disposed between the light emitting layer 233R emitting red light of the sub-pixels 120R and 130R emitting red light and the first electrode 231, that is, the anode electrode. Accordingly, in order that light emission is mainly generated in the light emitting layer 233R emitting red light of the sub-pixels 120R and 130R emitting red light, holes supplied from the first electrode 231 may preferably quickly pass through the light emitting layer 233G emitting green light and arrive at the light emitting layer 233R emitting red light. Accordingly, the hole mobility of the light emitting layer 233G emitting green light of the sub-pixels 120R and 130R may preferably be higher than the hole mobility of the light emitting layer 233R emitting red light.

To this end, the light emitting layer 233G emitting green light may be formed of a material containing, e.g., a dialkylamine(—NR2) electron donor side group, and the light emitting layer 233R emitting red light may be formed of a material containing, e.g., a methoxy electron donor side group. In order that light emission is mainly generated in the light emitting layer 233R emitting red light of the sub-pixels 120R and 130R emitting red light, electrons supplied from the second electrode 235 may preferably not pass through the light emitting layer 233R emitting red light. Accordingly, the electron mobility of the light emitting layer 233R emitting red light may preferably be higher than the electron mobility of the light emitting layer 233G emitting green light. To this end, the light emitting layer 233R emitting red light may be formed of a material containing, e.g., a fluorine (—F) electron acceptor side group, and the light emitting layer 233G emitting green light may be a material containing, e.g., a cyano group (—CN) electron acceptor side group.

The above description is not limited to the sub-pixels 120R and 130R emitting red light, and may also be applied to the sub-pixels 110B and 120B emitting blue light. In other words, regarding the OLED display device of FIG. 7, when the first electrode 231 is an anode electrode and the second electrode 235 is a cathode electrode, and the light emitting layer 233G emitting green light of the sub-pixels 110B and 120B emitting blue light is disposed between the light emitting layer 233B of the sub-pixels 110B and 120B emitting blue light and the first electrode 231, which is an anode electrode, holes supplied from the first electrode 231 may preferably quickly pass through the light emitting layer 233G emitting green light and arrive at the light emitting layer 233B emitting blue light, and the electrons supplied from the second electrode 235 may preferably not pass the light emitting layer 233B emitting blue light.

Accordingly, the hole mobility of the light emitting layer 233G emitting green light of the sub-pixels 110B and 120B emitting blue light may preferably be higher than the hole mobility of the light emitting layer 233B emitting blue light. To this end, the light emitting layer 233G emitting green light may be formed of a material containing a dialkylamine (—NR2) electron donor side group, and the light emitting layer 233B emitting blue light may be formed of a material containing a methoxy electron donor side group.

Also, electron mobility of the light emitting layer 233B emitting blue light may preferably be lower than the electron mobility of the light emitting layer 233G emitting green light. To this end, the light emitting layer 233R emitting red light may be formed of a material containing a fluorine (—F) electron acceptor side group, and the light emitting layer 233G emitting green light may be a material containing a cyano group (—CN) electron acceptor side group.

As described above, according to example embodiments, an OLED display device having high resolution may be manufactured, wherein light emitting layers of each of the sub-pixels may be easily deposited, and patterns of the sub-pixels may be manufactured with increased precision.

Although embodiments of the present invention including a structure in which a light emitting layer is interposed between the first electrode 231 and the second electrode 235 have been described above, other various intermediate layers than a light emitting layer such as a hole injection layer, a hole transport layer, an electron transport layer, and an electron injection layer may be inserted. The intermediate layer may be formed as one unit with the substrate over the entire surface of the substrate, or may be formed for each of pixels or for each of sub-pixels, or may be formed as one unit with a plurality of the pixels or with a plurality of the sub-pixels.

While the present invention has been particularly shown and described with reference to exemplary embodiments thereof, it will be understood by those of ordinary skill in the art that various changes in form and details may be made therein without departing from the spirit and scope of the present invention as defined by the following claims.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display device, comprising:
    a plurality of pixels including sub-pixels arranged in a predetermined order along a first direction, each sub-pixel emitting red, green, or blue light, and the predetermined order of the sub-pixels including sub-pixels arranged in an order emitting red, green, and blue lights along the first direction or in a reverse order,
    wherein an arrangement of colors of light emitted from respective sub-pixels of one pixel is symmetrical to an arrangement of colors of light emitted from respective sub-pixels of an adjacent pixel along the first direction, an axis of symmetry of the symmetrical arrangements being a space between the adjacent pixels, and
    wherein a light emitting layer of the sub-pixel emitting red light includes a light emitting layer emitting red light and a light emitting layer emitting green light, a light emitting layer of the sub-pixel emitting the green light includes a light emitting layer emitting green light, and a light emitting layer of the sub-pixel emitting blue light includes a light emitting layer emitting blue light and a light emitting layer emitting green light.

2. The OLED device as claimed in claim 1, wherein each of the sub-pixels includes a first electrode and a second electrode facing each other, the light emitting layer of each of the sub-pixels being interposed between the first electrode and the second electrode, and
    wherein the light emitting layer emitting red light of two sub-pixels adjacent to each other with respect to a space between the adjacent pixels along the first direction is formed as one unit, and the light emitting layer emitting blue light of two sub-pixels adjacent to each other with respect to a space between the adjacent pixels along the first direction is formed as one unit.

3. The OLED device as claimed in claim 1, wherein the light emitting layer emitting green light of the plurality of the sub-pixels is formed as one unit.

4. The OLED as claimed in claim 1, wherein each of the sub-pixels includes an anode electrode and a cathode electrode facing each other, the light emitting layer of each of the sub-pixels being interposed between the anode electrode and the cathode electrode,
    a light emitting layer emitting red light of the sub-pixel emitting red light being disposed between a light emitting layer emitting green light of the sub-pixel emitting red light and the anode electrode, and
    a light emitting layer emitting blue light of the sub-pixel emitting blue light being disposed between a light emitting layer emitting green light of the sub-pixel emitting blue light and the anode electrode.

5. The OLED as claimed in claim 4, wherein a hole mobility of the light emitting layer emitting red light of the sub-pixel emitting red light is lower than a hole mobility of the light emitting layer emitting green light, and an electron mobility of the light emitting layer emitting green light is higher than an electron mobility of the light emitting layer emitting red light.

6. The OLED as claimed in claim 4, wherein a hole mobility of the light emitting layer emitting blue light of the sub-pixel emitting blue light is lower than a hole mobility of the light emitting layer emitting green light, and an electron mobility of the light emitting layer emitting green light is higher than an electron mobility of the light emitting layer emitting blue light.

7. The OLED as claimed in claim 1, wherein each of the sub-pixels includes an anode electrode and a cathode electrode facing each other, a light emitting layer of each of the sub-pixels being interposed between the anode electrode and the cathode electrode,
    a light emitting layer emitting green light of the sub-pixel emitting red light being disposed between a light emitting layer emitting red light of the sub-pixel emitting red light and the anode electrode, and
    a light emitting layer emitting green light of the sub-pixel emitting blue light being disposed between a light emitting layer emitting blue light of the sub-pixel emitting blue light and the anode electrode.

8. The OLED as claimed in claim 7, wherein an electron mobility of the light emitting layer emitting red light of the sub-pixel emitting red light is lower than an electron mobility of the light emitting layer emitting green light, and a hole mobility of the light emitting layer emitting green light is higher than a hole mobility of the light emitting layer emitting red light.

9. The OLED as claimed in claim 7, wherein an electron mobility of the light emitting layer emitting blue light of the sub-pixel emitting blue light is lower than an electron mobility of the light emitting layer emitting green light, and a hole mobility of the light emitting layer emitting green light is higher than a hole mobility of the light emitting layer emitting blue light.

10. The OLED as claimed in claim 1, wherein the sub-pixels in a second direction emit light of a same color, the second direction being perpendicular to the first direction.

11. The OLED as claimed in claim 10, wherein each of the sub-pixels includes a first electrode and a second electrode facing each other, a light emitting layer of each of the sub-pixels being between the first electrode and the second electrode, and
    wherein the light emitting layer emitting red light of two sub-pixels adjacent to each other with respect to a space between the adjacent pixels along the first direction is formed as one unit, and the light emitting layer emitting blue light of two sub-pixels adjacent to each other with respect to a space between the adjacent pixels along the first direction is formed as one unit.

12. The OLED as claimed in claim 11, wherein the light emitting layers of the sub-pixels in the second direction are formed as one unit.

13. The OLED display device as claimed in claim 1, wherein the arrangement of sub-pixels along the first direction with respect to color of light emitted from respective sub-pixels includes an order of red, green, blue, blue, green, red, red, green, blue, blue, and so forth.

14. A method of forming an organic light emitting diode (OLED) display device, comprising:

forming a plurality of pixels including sub-pixels in a predetermined order along a first direction, each sub-pixel emitting red, green, or blue light, and the predetermined order of the sub-pixels including sub-pixels arranged in an order emitting red, green, and blue lights along the first direction or in a reverse order, wherein the sub-pixels formed in the pixels along the first direction are disposed, such that the arrangement of colors of light emitted from sub-pixels of one pixel is symmetrical to an arrangement of colors of light emitted from sub-pixels of an adjacent pixel along the first direction, an axis of symmetry of the symmetrical arrangements being a space between the adjacent pixels, and wherein a light emitting layer of the sub-pixel emitting red light includes a light emitting layer emitting red light and a light emitting layer emitting green light, a light emitting layer of the sub-pixel emitting the green light includes a light emitting layer emitting green light, and a light emitting layer of the sub-pixel emitting blue light includes a light emitting layer emitting blue light and a light emitting layer emitting green light.

15. The method as claimed in claim 14, wherein forming each sub-pixel includes forming the light emitting layer between a first electrode and a second electrode, light emitting layers emitting red light or light emitting layers emitting blue light of two adjacent sub-pixels of respective pixels adjacent to each other along the first direction being formed as one unit via a single opening in a deposition mask.

16. The method as claimed in claim 15, wherein a light emitting layer emitting green light is formed as one unit.

17. The method as claimed in claim 15, wherein the sub-pixels in a second direction are arranged to emit light of a same color, the second direction being perpendicular to the first direction.

18. The method as claimed in claim 17, wherein the light emitting layers of the sub-pixels in the second direction are formed as one unit.

* * * * *